US011997785B2

(12) United States Patent
Liao et al.

(10) Patent No.: US 11,997,785 B2
(45) Date of Patent: May 28, 2024

(54) CIRCUIT BOARD

(71) Applicant: Unimicron Technology Corp., Taoyuan (TW)

(72) Inventors: Chun-Lin Liao, Taoyuan (TW); Pei-Chang Huang, Taoyuan (TW)

(73) Assignee: Unimicron Technology Corp., Taoyuan (TW)

(*) Notice: Subject to any disclaimer, the term of this patent is extended or adjusted under 35 U.S.C. 154(b) by 52 days.

(21) Appl. No.: 17/577,359

(22) Filed: Jan. 17, 2022

(65) Prior Publication Data

US 2023/0180382 A1 Jun. 8, 2023

(30) Foreign Application Priority Data

Dec. 3, 2021 (TW) .................................. 110145260

(51) Int. Cl.
*H05K 1/00* (2006.01)
*H05K 1/02* (2006.01)

(52) U.S. Cl.
CPC ...... *H05K 1/0272* (2013.01); *H05K 2201/0116* (2013.01); *H05K 2201/10371* (2013.01)

(58) Field of Classification Search
CPC .. H05K 1/0272; H05K 1/0218; H05K 1/0203; H05K 1/185; H05K 2201/0116; H05K 2201/10371; H05K 3/4697
USPC ........................................................ 361/699
See application file for complete search history.

(56) References Cited

U.S. PATENT DOCUMENTS

| 11,153,965 | B1* | 10/2021 | Jennings | ............... | H05K 1/0272 |
| 2012/0043127 | A1* | 2/2012 | Lin | ...................... | H05K 1/0203 174/266 |
| 2018/0153030 | A1* | 5/2018 | Viswanathan | ....... | H05K 1/0218 |
| 2021/0014963 | A1* | 1/2021 | Tain | ...................... | H05K 1/0272 |
| 2021/0219428 | A1* | 7/2021 | Ingelhag | ............... | H01L 23/427 |

FOREIGN PATENT DOCUMENTS

| CN | 209845439 U | 12/2019 |
| CN | 112839476 A | 5/2021 |
| JP | 2021-124209 A | 8/2021 |
| JP | 2021-158190 A | 10/2021 |
| TW | 200951165 A | 12/2009 |
| TW | 201210415 A | 3/2012 |
| TW | I701991 B | 8/2020 |
| TW | 202103543 A | 1/2021 |

* cited by examiner

*Primary Examiner* — Zhengfu J Feng
(74) *Attorney, Agent, or Firm* — CKC & Partners Co., LLC

(57) ABSTRACT

A circuit board includes an insulation part, a support layer disposed on the insulation part, a metal case disposed in the insulation part, a heat-exchanging fluid distributed within the enclosed space, and a first porous material distributed within the enclosed space. The metal case is thermally coupled to the support layer and includes a first inner surface, a second inner surface opposite to the first inner surface and positioned between the first inner surface and the support layer, a third inner surface connecting the first inner surface and the second inner surface, and an enclosed space surrounded by the first inner surface, the second inner surface and the third inner surface. The first porous material is disposed on the first inner surface.

10 Claims, 6 Drawing Sheets

CIRCUIT BOARD

CROSS-REFERENCE TO RELATED APPLICATION

This application claims priority to Taiwan Application Serial Number 110145260 filed Dec. 3, 2021, which is herein incorporated by reference in its entirety.

BACKGROUND

Field of Invention

The present disclosure relates to a circuit board and a method of manufacturing thereof, and particularly to a circuit board having a heat dissipation function and a method of manufacturing thereof.

Description of Related Art

The electronic device may include circuit boards and electronic components such as integrated circuit (IC) disposed on the circuit boards. The electronic components produce heat during operation and accumulation of heat in the electronic components and the circuit boards may cause overheat in the electronic components influencing the performance of electronic components and even burning down the electronic components. Thus, the circuit boards having heat dissipation functions can prevent rising temperatures in the electronic components due to accumulation of heat, thereby enhancing the performance of the electronic components.

SUMMARY

An aspect of the present disclosure provides a circuit board including an insulation part, a support layer disposed on the insulation part, a metal case disposed in the insulation part, a heat-exchanging fluid distributed within the enclosed space, and a first porous material distributed within the enclosed space. The metal case is thermally coupled to the support layer and includes a first inner surface, a second inner surface opposite to the first inner surface and positioned between the first inner surface and the support layer, a third inner surface connecting the first inner surface and the second inner surface, and an enclosed space surrounded by the first inner surface, the second inner surface and the third inner surface. The first porous material is disposed on the first inner surface.

An aspect of the present disclosure provides a method of manufacturing a circuit board including forming a recess in a first insulation part, forming a first metal subcase in the recess, disposing a first porous material in the first metal subcase, distributing a heat-exchanging fluid in the first metal subcase, forming a second metal subcase on a second insulation part, and bonding the first insulation part and the second insulation part such that the first metal subcase and the second metal subcase merge to form a metal case with an enclosed space. The heat-exchanging fluid and the first porous material are sealed within the enclosed space of the metal case.

The present disclosure discloses various embodiments to provide a circuit board and a method of manufacturing thereof. A path of heat transfer additionally arranged in the circuit board can facilitate heat dissipation out of the circuit board, thereby enhancing the performance of electronic components disposed on the circuit board.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows.

DETAILED DESCRIPTION

Figure 1:
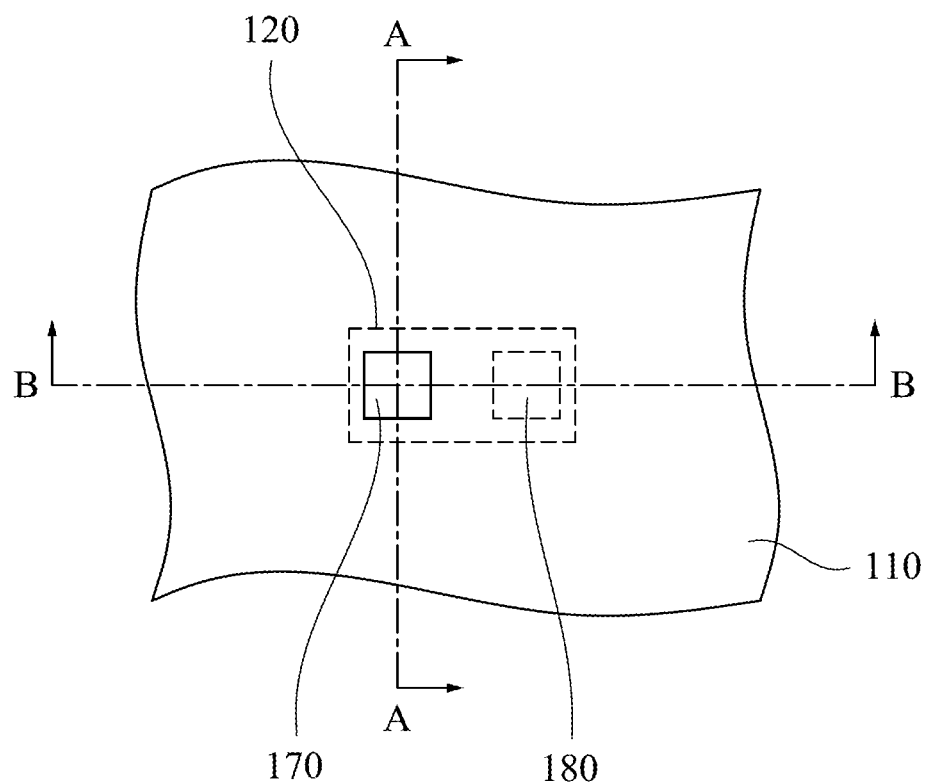
FIG. 1 is a simplified top view of a circuit board according to some embodiments of the present disclosure.
Figure 1:
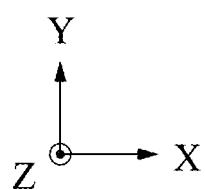

Reference will now be made in detail to the present embodiments of the disclosure, examples of which are illustrated in the accompanying drawings. Wherever possible, the same reference numbers are used in the drawings and the description to refer to the same or like parts.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present disclosure.

Heat generated during an electronic component in operation can be dissipated through a heat-dissipating member (e.g., a heat sink) disposed on a circuit board to prevent accumulation of heat within the electronic component and the circuit board, and further prevent a decline in performance of the electronic component due to overheat of the electronic components. The efficiency of heat dissipation can be influenced by the path or rate of heat transfer between the electronic component and the heat-dissipating member. The disclosure provide a circuit board having a heat dissipation function and a method of manufacturing thereof. An additional path of heat transfer between the electronic component and the heat-dissipating member are configured to facilitate heat dissipation out of the circuit board and to increase flexibility of arrangement of the electronic component and the heat-dissipating member, thereby enhancing the performance of electronic components disposed on the circuit board.

Referring to FIG. 1, FIG. 1 is a simplified top view of a circuit board 100 according to some embodiments of the present disclosure. The circuit board 100 can include an insulation part 110, a metal case 120 disposed in the insulation part 110, an electronic component 170 disposed on the insulation part 110, and a heat-dissipating member 180 disposed below the insulation part 110. The broken line in FIG. 1 indicates an exemplary arrangement of the metal case 120 within the insulation part 110 and the heat-dissipating member 180 below the insulation part 110.

As shown in FIG. 1, the electronic component 170 and the heat-dissipating member 180 may be in an extent of the metal case 120. When a location of the electronic component 170 and a location of the heat-dissipating member 180 are changed according to various product designs or process requirement, the extent of the metal case 120 can correspondingly be adjusted with the location of the electronic component 170 and the location of the heat-dissipating member 180. In some embodiments as FIG. 1, the location of the electronic component 170 and the location of the heat-dissipating member 180 can be spaced apart from each other (e.g., spaced apart in the X direction). In some other embodiments, the location of the electronic component 170 and the location of the heat-dissipating member 180 can partly overlap (e.g., partly overlap in the X direction).

Figure 2A:
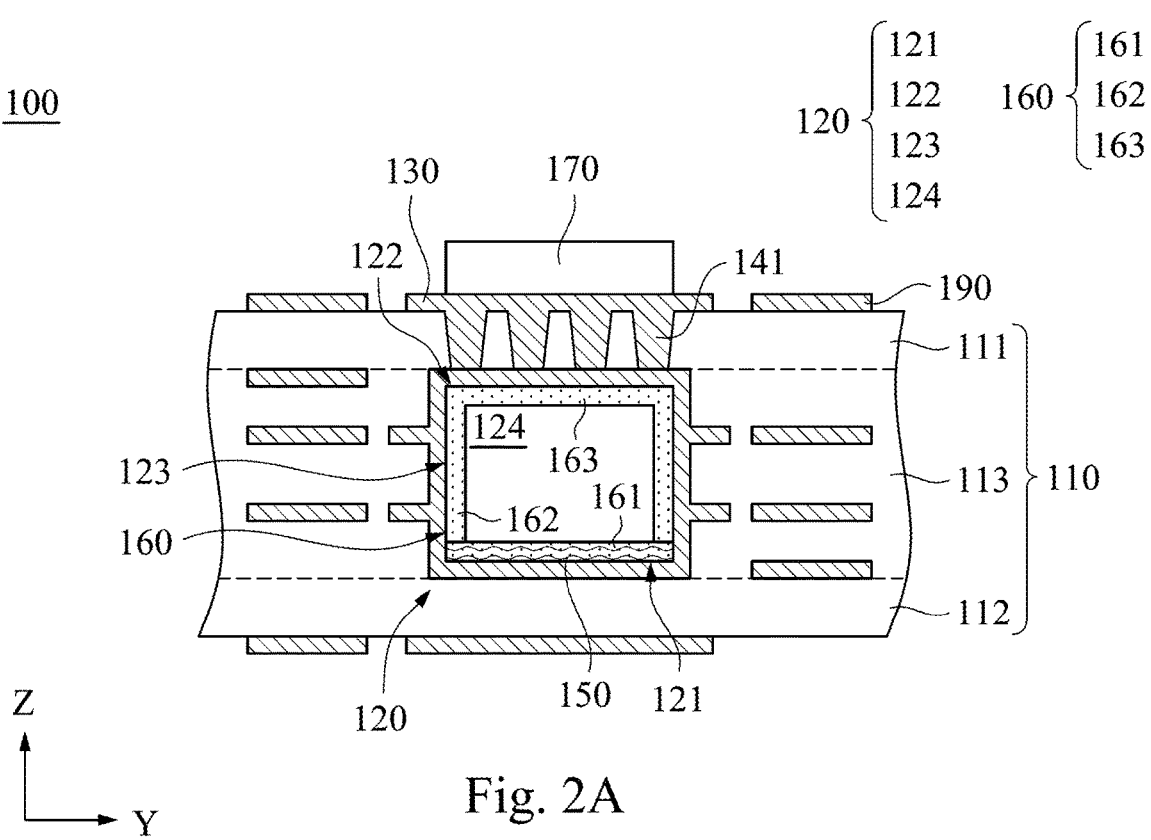
FIG. 2A is a cross-sectional view of the circuit board taken along line A-A of FIG. 1 according to some embodiments of the present disclosure.
Figure 2B:
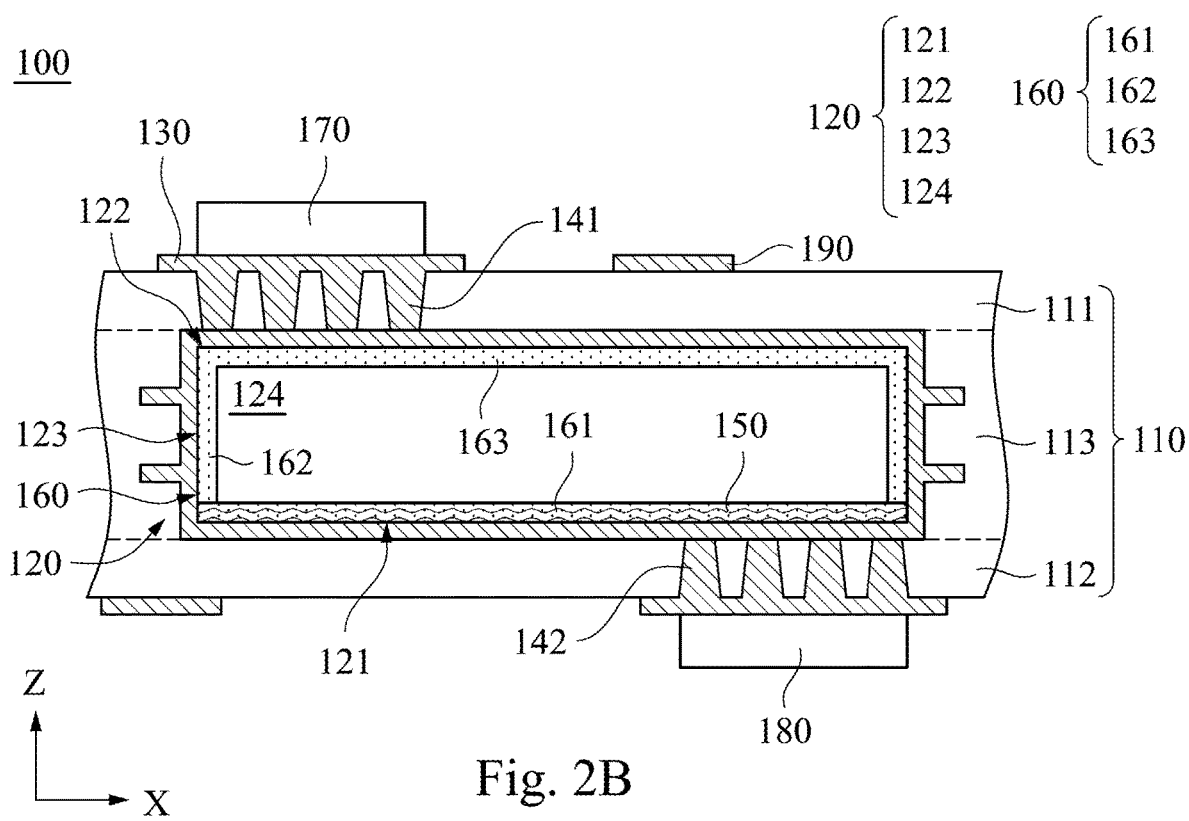
FIG. 2B is a cross-sectional view of the circuit board taken along line B-B of FIG. 1 according to some embodiments of the present disclosure.

Referring to FIG. 2A and FIG. 2B, FIG. 2A is a cross-sectional view of the circuit board 100 taken along line A-A of FIG. 1 according to some embodiments of the present disclosure, and FIG. 2B is a cross-sectional view of the circuit board 100 taken along line B-B of FIG. 1 according to some embodiments of the present disclosure. It is noted that, for the purpose of clarity, FIG. 1 has been simplified and only a few components of the circuit board 100 are illustrated in FIG. 1. Therefore, components shown in the FIG. 2A or FIG. 2B (cross-sectional view) may not totally correspond to the components shown in in FIG. 1 (top view).

The electronic component 170 can be disposed on the insulation part 110 and the metal case 120. The heat-dissipating member 180 can be disposed below the insulation part 110 and the metal case 120. It is noted that, the heat-dissipating member 180 may only be illustrated in FIG. 2B due to the observation angle.

The insulation part 110 can be a multilayer structure including a first dielectric layer 111 between the electronic component 170 and the metal case 120, a second dielectric layer 112 between the heat-dissipating member 180 and the metal case 120, and a third dielectric layer 113 between the first dielectric layer 111 and the second dielectric layer 112. The electronic component 170 can be disposed on the first dielectric layer 111 and the heat-dissipating member 180 can be disposed below the second dielectric layer 112. Although the first dielectric layer 111 and the second dielectric layer 112 are respectively illustrated as a single layer structure, yet the first dielectric layer 111, the second dielectric layer 112 and the third dielectric layer 113 can individually include one or more dielectric layers depends on product design or process requirement.

The insulation part 110 can include FR-4, epoxy resin, prepreg (PP), or ceramic, but the present disclosure is not limit thereto.

The metal case 120 can be embedded in the insulation part 110. Particularly, the metal case 120 may be disposed between the first dielectric layer 111 and the second dielectric layer 112 and extend within the third dielectric layer 113. In other words, the insulation part 110 can entirely wrap the metal case 120. Since the metal case 120 is disposed between the electronic component 170 and the heat-dissipating member 180, the vertical dimension (e.g., the dimension along the Z direction) of the metal case 120 may be smaller than or the same as the vertical distance between the electronic component 170 and the heat-dissipating member 180. In some embodiments, the vertical dimension (e.g., the dimension along the Z direction) of the metal case 120 is larger than a thickness of a single dielectric layer.

The metal case 120 can include a first inner surface 121, a second inner surface 122 opposite to the first inner surface 121, and a third inner surface 123 connecting the first inner surface 121 and the second inner surface 122. The first inner surface 121 may be positioned in proximity of the heat-dissipating member 180 and the second inner surface 122 may be positioned in proximity of the electronic component 170. The metal case 120 can further include an enclosed space 124 surrounded by the first inner surface 121, the second inner surface 122 and the third inner surface 123, indicating that the enclosed space 124 can be defined by the metal case 120. Because the metal case 120 is designed to dispose in the insulation part 110, the insulation part 110 can be hollow due to the enclosed space 124 of the metal case 120. In some embodiments, the metal case 120 can be made of metal (such as copper) or alloy.

The circuit board 100 can further include a support layer 130, a first thermally conductive post 141 and a second thermally conductive post 142. The support layer 130 can be disposed on the insulation part 110 (e.g., on the first dielectric layer 111) and the electronic component 170 can be disposed on the support layer 130 and thermally coupled to the support layer 130. The first thermally conductive post 141 can be disposed in the insulation part 110 and positioned between the support layer 130 and the metal case 120. In some embodiments, the first thermally conductive post 141 can connect the support layer 130 and the metal case 120. Specifically, the first thermally conductive post 141 can be disposed in the first dielectric layer 111 and thermally coupled to the support layer 130 and the metal case 120. Accordingly, the electronic component 170 can be thermally coupled to the metal case 120 through the support layer 130 and the first thermally conductive post 141.

In some embodiments, the support layer 130 and the first thermally conductive post 141 are used to transfer heat rather than an electrical current. In such embodiments, the electronic component 170 may not be electrically connected to the metal case 120. Hence, a path of an electrical signal and a path of heat transfer may not influence each other such that the risk of interference in the electronic component 170 during operation or degrading the electronic component 170 can be reduced. Consequently, the design of a system (e.g., the circuit board 100) can be simplified. In some embodiments, the first thermally conductive post 141 can be omitted and the electronic component 170 can be thermally coupled to the metal case 120 through the support layer 130.

The second thermally conductive post 142 can be disposed below the insulation part 110 and positioned between the heat-dissipating member 180 and the metal case 120. The second thermally conductive post 142 may connect the heat-dissipating member 180 and the metal case 120. Specifically, the second thermally conductive post 142 can be disposed in the second dielectric layer 112 and thermally coupled to the heat-dissipating member 180 and the metal case 120. Similar to the first thermally conductive post 141, the second thermally conductive post 142 provide functions of transferring heat and the heat-dissipating member 180 can be thermally coupled to the metal case 120 through the second thermally conductive post 142. In addition, in some embodiments, the second thermally conductive post 142 is not used to transfer an electrical current.

The support layer 130, the first thermally conductive post 141 and the second thermally conductive post 142 can be made of any thermally conductive material, for example metal, ceramic and the like. In some embodiments, the support layer 130, the first thermally conductive post 141 and the second thermally conductive post 142 can be made of copper.

The circuit board 100 can further include a heat-exchanging fluid 150 placed in the metal case 120. Specifically, the heat-exchanging fluid 150 can be sealed in the metal case 120 and distributed in the enclosed space 124. In some embodiments, the heat-exchanging fluid 150 can flow in the enclosed space 124. The heat-exchanging fluid 150 can include a liquid and a gas in the metal case 120. That is, the heat-exchanging fluid 150 can be in a form of liquid and in a form of gas.

The material of the heat-exchanging fluid 150 can include ammonia (in a form of liquid), acetone, methanol, ethanol, heptane, water, other suitable materials, or a combination thereof. Due to the fact that the heat-exchanging fluid 150 absorbs and releases heat during its phase change (will be discussed later), the material of the heat-exchanging fluid 150 can be selected based on the operating temperature of the circuit board 100 to ensure the phase change of the heat-exchanging fluid 150 may happen in a range of the operating temperature of the circuit board 100. In some embodiments, the operating temperature of the circuit board 100 is between about −70° C. and about 200° C. Therefore, materials whose phase change may happen at −70° C. to about 200° C. can be used as the heat-exchanging fluid 150.

The circuit board 100 can further include a porous material 160 disposed in the metal case 120. Specifically, the porous material 160 can be sealed in the metal case 120 and distributed in the enclosed space 124. In some embodiments, the porous material 160 may be disposed on the inner surfaces of the metal case 120. In some embodiments, the porous material 160 may directly contact the metal case 120. The porous material 160 can be made of any thermally conductive material such as metal, ceramic and the like. In some embodiments, the porous material 160 can be made of copper, gold, silver, aluminum, other suitable materials, or a combination thereof. In some embodiments, the porous material 160 can be copper fiber.

The porous structure of the porous material 160 can allow the heat-exchanging fluid 150 to adsorb thereon. In addition, the porous structure of the porous material 160 can enlarge the surface area of the porous material 160. Therefore, the enlarged surface area of the porous material 160 may have more opportunities to be into contact with the heat-exchanging fluid 150, thereby enhancing heat transfer between the porous material 160 and the heat-exchanging fluid 150.

Heat generated by electronic component 170 during operation can be rapidly transferred to the metal case 120 through the support layer 130 and the first thermally conductive post 141. One area of the metal case 120 close to the electronic component 170 can be regarded as a heat input area, and the other area of the metal case 120 close to the heat-dissipating member 180 can be regarded as a hear output area. In the heat input area, the metal case 120 may directly transfer heat to the heat-exchanging fluid 150 in a form of liquid or indirectly transfer to the heat-exchanging fluid 150 in a form of liquid through the porous material 160. The heat-exchanging fluid 150 in a form of liquid may absorb heat and become a form of gas. The heat-exchanging fluid 150 in a form of gas may then move in a direction toward the heat-dissipating member 180. In other words, the heat-exchanging fluid 150 may mover from the heat input area to the heat output area.

The heat-exchanging fluid 150 in a form of gas can become the heat-exchanging fluid 150 in a form of liquid once the heat-exchanging fluid 150 in a form of gas arrives the heat output area. In the process of the phase change of the heat-exchanging fluid 150, heat originally stored in the heat-exchanging fluid 150 can be released and transferred to the metal case 120 and the porous material 160. Heat can further be transferred from the metal case 120 and the porous material 160 to the heat-dissipating member 180 through the second thermally conductive post 142. Then, heat-dissipating member 180 can transfer heat to the environment so heat can be dissipated away from the circuit board 100.

After the heat-exchanging fluid 150 in a form of gas becomes the heat-exchanging fluid 150 in a form of liquid, the heat-exchanging fluid 150 in a form of liquid can adsorb onto the porous material 160. Due to capillary effect, the heat-exchanging fluid 150 in a form of liquid can move from the heat output area (i.e., the metal case 120 close to the heat-dissipating member 180) to the heat input area (i.e., the metal case 120 close to the electronic component 170). As a result, the heat-exchanging fluid 150 can cycle in the metal case 120 and meanwhile heat generated by the electronic component 170 can be continuously transferred to and dissipated by the heat-dissipating member 180 by the aforementioned approach.

The arrangement of the porous material 160 can help the heat-exchanging fluid 150 to cycle in the metal case 120. In some embodiments, the porous material 160 at least includes a first porous material 161 disposed on the first inner surface 121 to help the heat-exchanging fluid 150 to laterally move (e.g., move along the XY plane). In some embodiments, the first porous material 161 can physically contact the first inner surface 121 such as heat can be transferred between the first porous material 161 and the metal case 120.

In some embodiments where the first porous material 161 is disposed, the porous material 160 can further include a second porous material 162 disposed on the third inner surface 123. In such embodiments, the second porous material 162 can transfer heat along a vertical direction (e.g., along the Z direction) and help the heat-exchanging fluid 150 to move along a vertical direction (e.g., along the Z direction). In some embodiments where the first porous material 161 and the second porous material 162 are disposed, the porous material 160 can further include a third porous material 163 disposed on the second inner surface 122 to provide additional heat transfer.

An extent of the heat-exchanging fluid 150 can be decided by the enclosed space 124 of the metal case 120. The porous material 160 disposed in the metal case 120 can help the heat-exchanging fluid 150 to move and cycle. When the metal case 120 is configured between and thermally coupled to the electronic component 170 and the heat-dissipating member 180, the metal case 120 can serve as a path of heat transfer between the electronic component 170 and the heat-dissipating member 180. In other words, the path of heat transfer between the electronic component 170 and the heat-dissipating member 180 can be designed according to system design or process requirement by manipulating the position and extent of the metal case 120.

In some embodiments, the path of heat transfer between the electronic component 170 and the heat-dissipating member 180 can be designed to laterally extend (e.g., along the XY plane), as shown in FIG. 1. In such embodiments, a projection of the electronic component 170 may not overlap a projection of the heat-dissipating member 180. In other words, a projection of the electronic component 170 on the first inner surface 121 may be spaced apart from a projection of the heat-dissipating member 180 on the first inner surface 121. Similarly, a projection of the first thermally conductive post 141 may not overlap a projection of the second thermally conductive post 142. In some other embodiments, the projection of the electronic component 170 on the first inner surface 121 may overlap the projection of the heat-dissipating member 180 on the first inner surface 121.

Consequently, the enclosed space 124 of the metal case 120 combined with the heat-exchanging fluid 150 and the porous material 160 can provide more alternative paths of heat transfer such that the design of the circuit board 100 can become more flexible and heat generated by the electronic component 170 can be transferred to the heat-dissipating member 180 by the alternative paths to improve the heat dissipation efficiency of the circuit board 100.

The circuit board 100 can further include a wiring layer 190. The wiring layer 190 and the metal case 120 can be electrically isolated to each other due to the insulation part 110. In other words, the wiring layer 190 may not be electrically connected to the metal case 120. Hence, the wiring layer 190 used to transfer an electrical signal and the metal case 120 used to transfer heat may not influence each other such that the risk of interference in the electronic component 170 during operation or degrading the electronic component 170 can be reduced. In addition, the design of a system (e.g., the circuit board 100) can be simplified.

FIG. 3, FIG. 4, FIG. 5, FIG. 6, FIG. 7 and FIG. 8 are cross-sectional views at various stages of a method of manufacturing the circuit board 100 according to some embodiments of the present disclosure. Various operations of embodiments are provided herein. FIG. 3, FIG. 4, FIG. 5, FIG. 6, FIG. 7 and FIG. 8 illustrate reference cross section consistent to FIG. 2A.

Unless otherwise illustrated, the order in which some or all of the operations are described should not be construed to imply that these operations are necessarily order dependent. Alternative ordering will be appreciated having the benefit of this description. Additional operations can be provided before, during, and/or after these operations, and may be briefly described herein. Further, it will be understood that not all operations are necessarily present in each embodiment provided herein. Also, it will be understood that not all operations are necessary in some embodiments.

Figure 3:
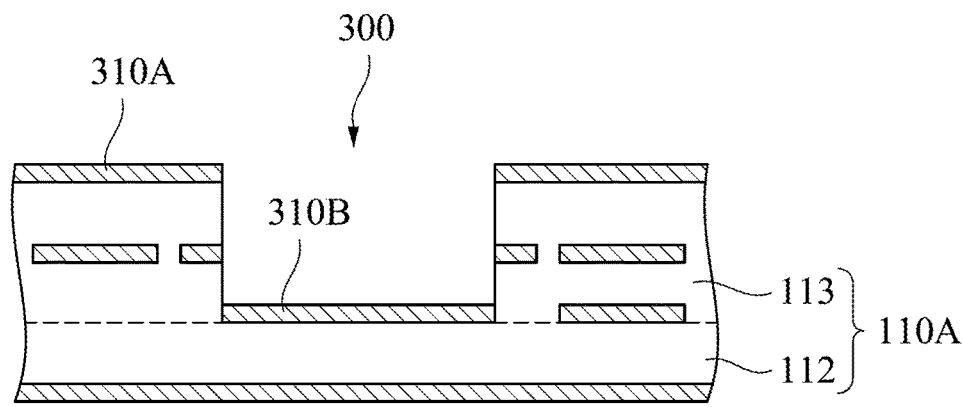
FIG. 3, FIG. 4, FIG. 5, FIG. 6, FIG. 7 and FIG. 8 are cross-sectional views at various intermediate stages of a method of manufacturing a circuit board according to some embodiments of the present disclosure.

Referring to FIG. 3, FIG. 3 illustrates an operation of forming a recess 300 in a first insulation part 110A. The first insulation part 110A can be a multilayer structure and in later stage form the second dielectric layer 112 and the third dielectric layer 113 as shown in FIG. 2A. The second thermally conductive post 142 (not shown in FIG. 3 but can be referred to FIG. 2B from the other observation angle) can be formed in the first insulation part 110A. The method of forming the recess 300 may include laser drill, mechanical drill, other suitable techniques, or a combination thereof. In some embodiments, a metal layer 310A is disposed on the first insulation part 110A. In some embodiments, a metal layer 310B is disposed on a lower surface of the recess 300. In some embodiments, the metal layer 310A and the metal layer 310B can be formed with different foils.

Figure 4:
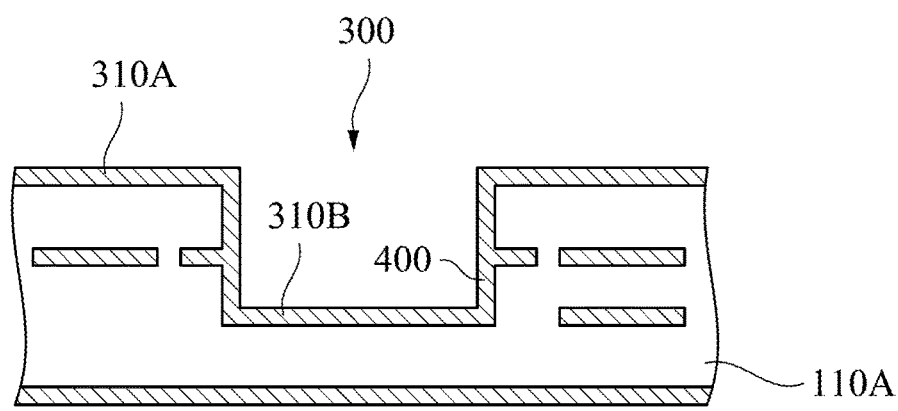
Figure 5:
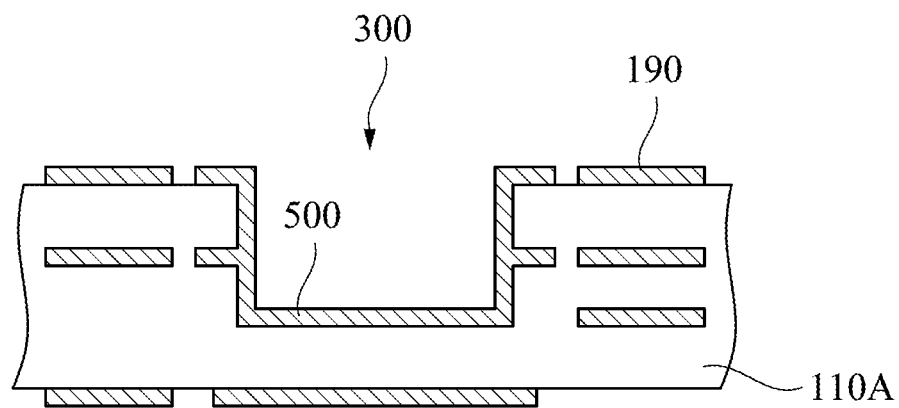

Referring to FIG. 4 and FIG. 5, FIG. 4 and FIG. 5 illustrate an operation of forming a first metal subcase 500 in the recess 300. In FIG. 4, a formation of the first metal subcase 500 can include a step of conformally depositing a metal material along an inner surface of the recess 300 such that a metal layer 400 may be formed on the side surface of the recess 300. The method of depositing the metal material can include an evaporation process, a sputtering process, an electroplating process, other suitable process, a combination thereof. For example, the metal layer 400 can be formed by applying an electroplating process. In some embodiments where an electroplating process is applied, the metal layer 400 can be formally deposited on the recess 300 with suitable electroplating parameters such as current density, electrolyte compositions and the like. In FIG. 5, the metal layer 310A is patterned to form the wiring layer 190. On the other hand, the metal layer 400 and the metal layer 310B can collectively form the first metal subcase 500 in the recess 300. Since the first metal subcase 500 is spaced apart from the wiring layer 190 after the patterning process, the first metal subcase 500 is not electrically connected to the wiring layer 190.

Figure 6:
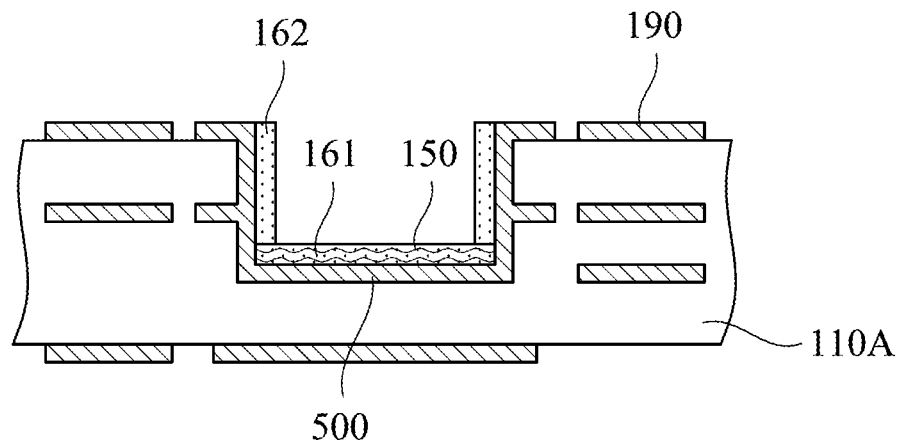

Referring to FIG. 6, FIG. 6 illustrates an operation of disposing the first porous material 161 in the first metal subcase 500. Particularly, the first porous material 161 is disposed on a lower surface of the first metal subcase 500. In some embodiments, the first porous material 161 may physically contact the first metal subcase 500.

In some embodiments, the first porous material 161 may be flat with a lateral size (e.g., the size along the XY plane) same as or larger than the lower surface of the first metal subcase 500 causing an edge of the first porous material 161 aligned with or put against the side surface of the first metal subcase 500 such as the first porous material 161 can be fixed in the first metal subcase 500. The second porous material 162 can further be disposed in the first metal subcase 500 after the first porous material 161 is disposed. A location of the second porous material 162 may be different from a location of the first porous material 161. For example, the second porous material 162 can be disposed on the side surface of the first metal subcase 500.

In FIG. 6, the heat-exchanging fluid 150 is placed in the first metal subcase 500. Particularly, the heat-exchanging fluid 150 in a form of liquid is distributed in the first metal subcase 500. The volume or weight of the heat-exchanging fluid 150 in a form of liquid to be placed in the first metal subcase 500 can be determined by product design, operating temperature of the circuit board 100, the properties of the heat-exchanging fluid 150 and the like.

Figure 7:
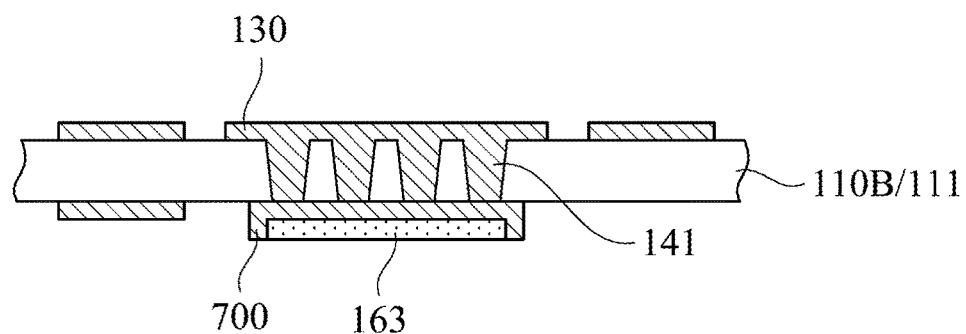

Referring to FIG. 7, FIG. 7 illustrates an operation of forming a second metal subcase 700 on a second insulation part 110B. The second insulation part 110B can be the first dielectric layer 111 shown in FIG. 2A. Moreover, the first thermally conductive post 141 can be formed in the second insulation part 110B and the support layer 130 can be formed on the second insulation part 110B.

A step of forming the second metal subcase 700 can include depositing a metal film and then patterning the aforementioned metal film. The method of depositing the metal film can include an evaporation process, a sputtering process, an electroplating process, other suitable process, a combination thereof. For example, an electroplating process is applied to deposit the metal film. In some embodiments, after the second metal subcase 700 is formed, the third porous material 163 can be disposed in the second metal subcase 700.

Figure 8:
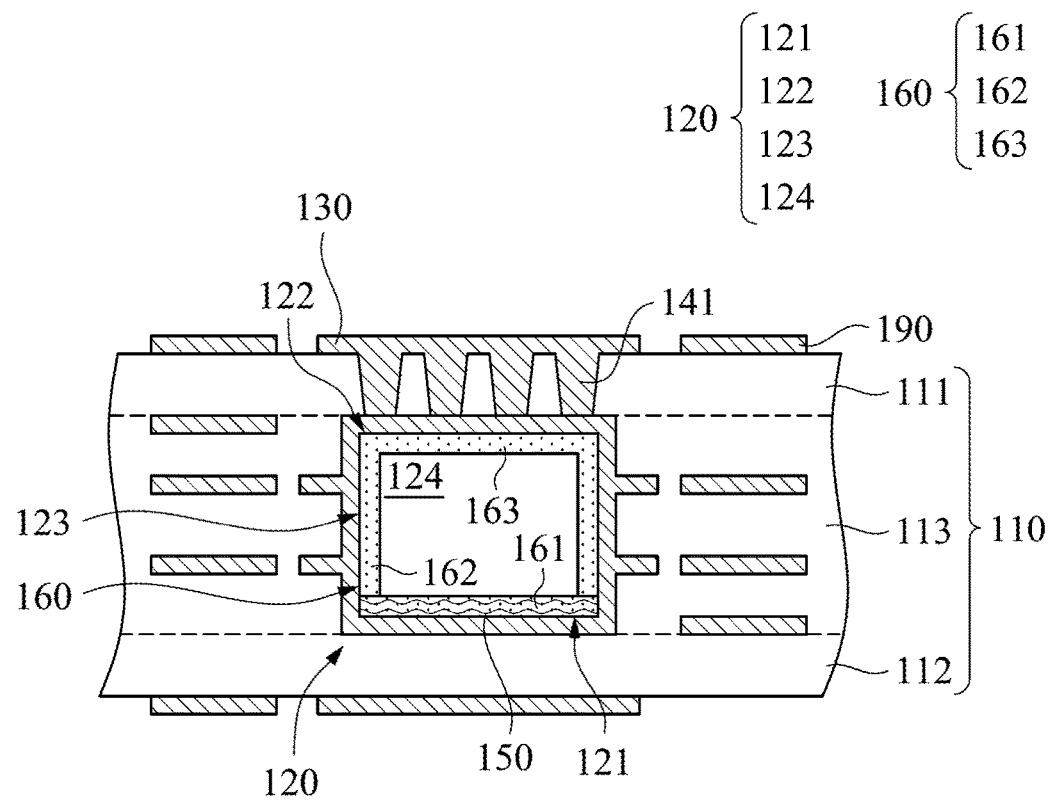

Referring to FIG. 8, FIG. 8 illustrates an operation of bonding the structure of FIG. 6 and the structure of FIG. 7. Specifically, the first insulation part 110A and the second insulation part 110B are bonded together to form the insulation part 110 such that the first metal subcase 500 (referring to FIG. 6) and the second metal subcase 700 (referring to FIG. 7) can be in alignment with each other and merge to form the metal case 120 with the enclosed space 124. After the bonding operation, the first porous material 161 and the heat-exchanging fluid 150 originally disposed in the first metal subcase 500 can be sealed in the enclosed space 124 of the metal case 120. In some embodiments, the second porous material 162 can be sealed in the metal case 120. In some embodiments, the third porous material 163 can be sealed in the metal case 120.

After the metal case 120 is formed, the electronic component 170 can be disposed on the structure of FIG. 8 (e.g., on the support layer 130) and the heat-dissipating member 180 can be disposed below the structure of FIG. 8, thereby forming the circuit board 100 as discussed previously in FIG. 2A and FIG. 2B.

Figure 9:
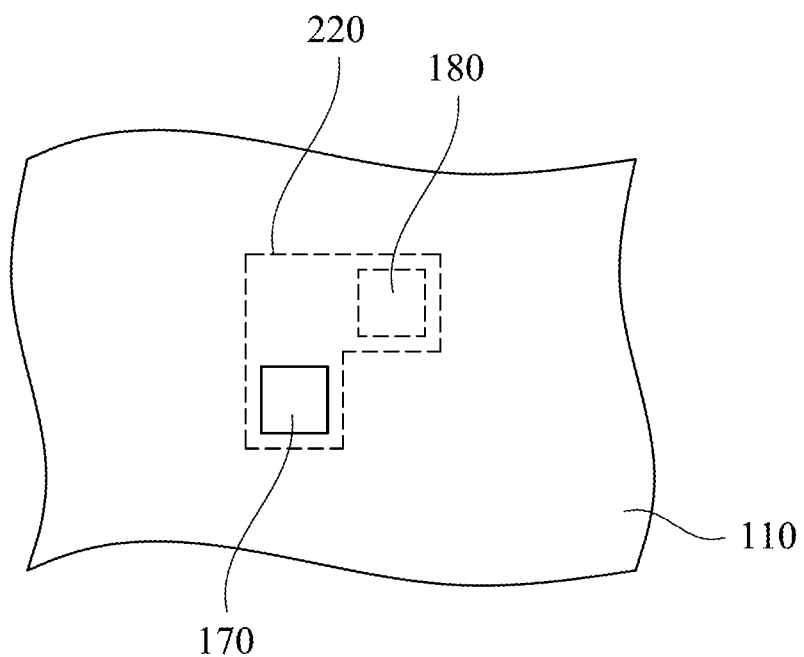
FIG. 9 is a simplified top view of a circuit board according to some other embodiments of the present disclosure.

Referring to FIG. 9, FIG. 9 is a simplified top view of a circuit board 200 according to some other embodiments of the present disclosure. The circuit board 200 shown in FIG. 9 is similar to the circuit board 100 shown in FIG. 1, and the difference therebetween is a profile of a metal case 220 in FIG. 9. Because the location of the electronic component 170 is separate from the location of the heat-dissipating member 180 in both the X direction and the Y direction, the profile of the metal case 220 from top view (e.g., the profile along the XY plane) can show a turning spot to connect the electronic component 170 and the heat-dissipating member 180. In an example shown in FIG. 9, the profile of the metal case 220 from top view (e.g., the profile along the XY plane) can be an L-shaped. FIG. 9 provide an exemplary arrangement of the metal case 220 to illustrate when the metal case 220, the heat-exchanging fluid 150 (referring to FIG. 2A) and the porous material 160 (referring to FIG. 2A) are implemented, the path of heat transfer between the electronic component 170 and the heat-dissipating member 180 is not necessary to be linear in top view. That is, the path of heat transfer between the electronic component 170 and the heat-dissipating member 180 can include turning spots in top view.

The present disclosure discloses various embodiments to provide a circuit board having a heat dissipation function and a method of manufacturing thereof. A metal case with an enclosed space, a heat-exchanging fluid and the porous material disposed in the circuit board can increase a path of heat transfer arranged in the circuit board, thereby improving the heat dissipation efficiency and increasing the flexibility of product design and process. Thus, the performance of the electronic component disposed on the circuit board can be enhanced.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A circuit board, comprising:
   an insulation part;
   a support layer disposed on the insulation part;
   a metal case disposed in the insulation part and thermally coupled to the support layer, wherein the metal case comprises:
   a first inner surface;
   a second inner surface opposite to the first inner surface and positioned between the first inner surface and the support layer;
   a third inner surface connecting the first inner surface and the second inner surface; and
   an enclosed space surrounded by the first inner surface, the second inner surface and the third inner surface;
   a heat-exchanging fluid distributed within the enclosed space;
   a first porous material distributed within the enclosed space and disposed on the first inner surface;
   an electronic component disposed on the support layer and thermally coupled to the metal case through the support layer, wherein the metal case and the electronic component are not electrically connected to each other; and
   a heat-dissipating member disposed below and thermally coupled to the metal case, wherein the metal case is positioned between the electronic component and the heat-dissipating member.

2. The circuit board of claim 1, wherein a projection of the electronic component on the first inner surface is spaced apart from a projection of the heat-dissipating member on the first inner surface.

3. The circuit board of claim 1, further comprising:
   a first thermally conductive post disposed in the insulation part and between the support layer and the metal case, and connecting the support layer and the metal case.

4. The circuit board of claim 3, wherein the insulation part comprises a first dielectric layer and a second dielectric layer, wherein the metal case is disposed between the first dielectric layer and the second dielectric layer, and the first thermally conductive post is disposed in the first dielectric layer and thermally coupled to the support layer and the metal case.

5. The circuit board of claim 4, further comprising:
   a second thermally conductive post disposed in the second dielectric layer and below the metal case, and connected to the metal case.

6. The circuit board of claim 1, wherein the insulation part entirely wraps the metal case.

7. The circuit board of claim 1, wherein the first porous material physically contacts the metal case.

8. The circuit board of claim 1, wherein the heat-exchanging fluid comprises a liquid and a gas.

9. The circuit board of claim 1, further comprising:
   a second porous material disposed on the third inner surface.

10. The circuit board of claim 9, further comprising:
    a third porous material disposed on the second inner surface.

* * * * *